US012609168B2

(12) United States Patent
Zhao

(10) Patent No.: US 12,609,168 B2
(45) Date of Patent: Apr. 21, 2026

(54) OFFSET VOLTAGE BASED OPERATION METHOD OF MEMORY SYSTEM, DATA READ METHOD OF MEMORY AND MEMORY SYSTEM

(71) Applicant: YANGTZE MEMORY TECHNOLOGIES CO., LTD., Wuhan (CN)

(72) Inventor: XiangNan Zhao, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 74 days.

(21) Appl. No.: 18/424,043

(22) Filed: Jan. 26, 2024

(65) Prior Publication Data

US 2025/0095749 A1     Mar. 20, 2025

(30) Foreign Application Priority Data

Sep. 15, 2023    (CN) .......................... 202311199368.0

(51) Int. Cl.
*G11C 16/26* (2006.01)
*G11C 16/08* (2006.01)
*G11C 16/30* (2006.01)

(52) U.S. Cl.
CPC .............. *G11C 16/26* (2013.01); *G11C 16/08* (2013.01); *G11C 16/30* (2013.01)

(58) Field of Classification Search
CPC ......... G11C 16/26; G11C 16/08; G11C 16/30; G11C 11/5642; G11C 16/0483
See application file for complete search history.

(56) References Cited

U.S. PATENT DOCUMENTS

| | | | |
|---|---|---|---|
| 2017/0162270 A1* | 6/2017 | Park ...................... | G11C 29/021 |
| 2022/0253352 A1* | 8/2022 | Liu ...................... | G06F 11/1068 |
| 2023/0119534 A1* | 4/2023 | Lee ...................... | G11C 11/4074 365/189.011 |
| 2023/0368845 A1* | 11/2023 | Rao ...................... | G11C 11/5642 |
| 2024/0087655 A1* | 3/2024 | Rao ......................... | G11C 16/08 |
| 2024/0177781 A1* | 5/2024 | Lien ..................... | G11C 11/5642 |

* cited by examiner

*Primary Examiner* — Khamdan N. Alrobaie
(74) *Attorney, Agent, or Firm* — Conley Rose, P.C.

(57) ABSTRACT

The present disclosure provides an operation method of a memory system, a data read method of a memory, and a memory system. The operation method includes: first determining an offset voltage value corresponding to a selected word line of N word lines according to a number N of the N word lines and offset voltage information, wherein the N word lines are word lines adjacently disposed in a memory block of a memory, data is stored in K memory cells coupled with the N word lines, K and N are positive integers, and the offset voltage information is used for indicating the offset voltage value corresponding to N; and then sending a data read command to the memory, wherein the data read command is used for instructing the memory to generate a read voltage according to the offset voltage value and apply the read voltage to the selected word line.

20 Claims, 7 Drawing Sheets

OFFSET VOLTAGE BASED OPERATION METHOD OF MEMORY SYSTEM, DATA READ METHOD OF MEMORY AND MEMORY SYSTEM

CROSS-REFERENCE TO RELATED APPLICATIONS

The present application claims priority to Chinese Patent Application No. 2023111993680, which was filed Sep. 15, 2023, is titled "OPERATION METHOD OF STORAGE SYSTEM, DATA READING METHOD OF MEMORY AND STORAGE SYSTEM," and is hereby incorporated herein by reference in its entirety.

TECHNICAL FIELD

Examples of the present disclosure relate to the storage field, and particularly to an operation method of a memory system, a data read method of a memory, and a memory system.

BACKGROUND

A three-dimensional (3D) NAND flash memory comprises a plurality of memory blocks. Each memory block comprises a plurality of pages. Each page comprises a plurality of memory cells. When data is written to some pages in one memory block, the memory block may be referred to as an open block. When data is written to all pages in one memory block, the memory block may be referred to as a close block.

As requirement for storage capacity of the 3D NAND flash memory continues increasing, the 3D NAND flash memory continues developing toward a smaller device size and more stacked layers, which results in an increased read retry ratio of the 3D NAND flash memory, degraded read performance of the 3D NAND flash memory, and poor user experience.

SUMMARY

Examples of the present disclosure provide an operation method of a memory system, a data read method of a memory, and a memory system, to mitigate an increased read retry ratio and degraded read performance of the NAND flash memory due to a threshold voltage offset of a memory cell.

To provide the above, the following technical features are adopted in the examples of the present disclosure.

In an aspect, an operation method of a memory system is provided. The method comprises: first determining an offset voltage value corresponding to a selected word line of N word lines according to a number N of the N word lines and offset voltage information, wherein the N word lines are word lines adjacently disposed in a memory block of a memory, data is stored in K memory cells coupled with the N word lines, K and N are positive integers, and the offset voltage information is used for indicating the offset voltage value corresponding to N; and then sending a data read command to the memory, wherein the data read command is used for instructing the memory to generate a read voltage according to the offset voltage value and apply the read voltage to the selected word line.

In an example, the above-mentioned offset voltage information may be in a table form, or may be in other forms, which is not limited in the examples of the present disclosure.

In an example, the above-mentioned selected word line may be one of the N word lines, or may be a plurality of word lines of the N word lines, which is not limited in the examples of the present disclosure.

In an example, the type of the above-mentioned K memory cells includes at least one of a single-level cell, a multi-level cell, a triple-level cell, and a quad-level cell, which is not limited in the examples of the present disclosure.

In the operation method of the memory system provided by the examples of the present disclosure, the offset voltage value corresponding to the selected word line of the N word lines is determined according to the number N of the N word lines and the offset voltage information, wherein the N word lines are word lines adjacently disposed in the memory block, and data is stored in the K memory cells coupled with the N word lines. It may be understood that for the offset voltage value determined in the examples of the present disclosure, it is taken into consideration that an offset of a threshold voltage of a memory cell in the memory block is different when the number of word lines in the memory block to which the data is written is different. Thus, the offset voltage value determined in the examples of the present disclosure is more accurate, and a read voltage determined based on the offset voltage value is more accurate, so that a read retry ratio of the memory can be reduced, and the read performance can be improved.

In some examples, the above-mentioned determining the offset voltage value corresponding to the selected word line of the N word lines according to the number N of the N word lines and the offset voltage information comprises: determining the offset voltage value corresponding to the selected word line according to N, location information of the selected word line and the offset voltage information, wherein the location information of the selected word line is used for indicating a location of the selected word line in the N word lines, and the offset voltage information is further used for indicating the offset voltage value corresponding to N and the location information of the selected word line.

In the operation method of the memory system provided by the examples of the present disclosure, the corresponding offset voltage value is determined according to the location information of the selected word line in the N word lines, so that the accuracy of the offset voltage value can be further improved. The memory applies a read voltage to the selected word line according to the offset voltage value, so that the read retry ratio can be further reduced, and the read performance can be further improved.

In some examples, the above-mentioned selected word line comprises a first selected word line or a second selected word line, the first selected word line comprises a first word line to an (N−1)th word line, and the second selected word line comprises an Nth word line; and the determining the offset voltage value corresponding to the selected word line according to N, the location information of the selected word line and the offset voltage information comprises: determining a first offset voltage value corresponding to the first selected word line according to N, location information of the first selected word line and the offset voltage information; or determining a second offset voltage value corresponding to the second selected word line according to N, location information of the second selected word line and the offset voltage information, wherein the first offset voltage value is less than the second offset voltage value.

In an example, the first selected word line comprises one of the first word line to the (N−1)th word line, or comprises a plurality of word lines of the first word line to the (N−1)th word line, which is not limited in the examples of the present disclosure.

In some examples, a memory cell of the above-mentioned K memory cells coupled with the selected word line is programmed into a plurality of programming states, and the determining the offset voltage value corresponding to the selected word line of the N word lines according to the number N of the N word lines and the offset voltage information comprises: determining the offset voltage value corresponding to the selected word line according to N, location information of the selected word line, a preset read voltage of a selected memory cell and the offset voltage information, wherein the selected memory cell is the memory cell of the K memory cells coupled with the selected word line, the preset read voltage of the selected memory cell is a read voltage corresponding to a programming state of the selected memory cell, and the offset voltage information is further used for indicating the offset voltage value corresponding to N, the location information of the selected word line, and the preset read voltage of the selected memory cell.

In an example, the selected memory cell may be one memory cell coupled with the selected word line, or may be a plurality of memory cells coupled with the selected word line, which is not limited in the examples of the present disclosure.

In the operation method of the memory system provided by the examples of the present disclosure, the corresponding offset voltage value is determined according to preset read voltages corresponding to various programming states of the memory cell, so that the accuracy of the offset voltage value can be further improved. The memory applies the read voltage to the selected word line according to the offset voltage value, so that the read retry ratio can be further reduced, and the read performance can be further improved.

In some examples, the above-mentioned memory block further comprises M word lines that are disposed adjacent to the N word lines, and L memory cells that are coupled with the M word lines, wherein the M word lines are disposed adjacently, data is not stored in the L memory cells, M is an integer greater than or equal to 0, and L is a positive integer; and the offset voltage information is determined according to a comparison between a first threshold voltage distribution when data is stored in the K memory cells and a second threshold voltage distribution when data is stored in the K memory cells and the L memory cells.

In another aspect, a data read method of a memory is further provided. The method comprises: first receiving a data read command, wherein the data read command is used for instructing the memory to generate a read voltage according to an offset voltage value and apply the read voltage to a selected word line of N word lines, wherein the offset voltage value is determined according to a number N of the N word lines and offset voltage information, the N word lines are word lines adjacently disposed in a memory block of the memory, data is stored in K memory cells coupled with the N word lines, K and N are positive integers, and the offset voltage information is used for indicating the offset voltage value corresponding to N; and then generating the read voltage and applying the read voltage to the selected word line according to the data read command.

In some examples, the above-mentioned offset voltage value is determined according to N, location information of the selected word line and the offset voltage information, wherein the location information of the selected word line is used for indicating a location of the selected word line in the N word lines, and the offset voltage information is further used for indicating the offset voltage value corresponding to N and the location information of the selected word line.

In some examples, the above-mentioned selected word line comprises a first selected word line or a second selected word line, the first selected word line comprises a first word line to an (N−1)th word line, the second selected word line comprises an Nth word line, and the offset voltage value comprises a first offset voltage value or a second offset voltage value. The first offset voltage value is determined according to N, location information of the first selected word line and the offset voltage information, the second offset voltage value is determined according to N, location information of the second selected word line and the offset voltage information, and the first offset voltage value is less than the second offset voltage value.

In some examples, a memory cell of the K memory cells coupled with the selected word line is programmed into a plurality of programming states; and the offset voltage value is determined according to N, location information of the selected word line, a preset read voltage of a selected memory cell and the offset voltage information, the selected memory cell is the memory cell of the K memory cells coupled with the selected word line, the preset read voltage of the selected memory cell is a read voltage corresponding to a programming state of the selected memory cell, and the offset voltage information is further used for indicating the offset voltage value corresponding to N, the location information of the selected word line, and the preset read voltage of the selected memory cell.

In some examples, the above-mentioned memory block further comprises M word lines that are disposed adjacent to the N word lines, and L memory cells that are coupled with the M word lines, wherein the M word lines are disposed adjacently, data is not stored in the L memory cells, M is an integer greater than or equal to 0, and L is a positive integer. The offset voltage information is determined according to a comparison between a first threshold voltage distribution when data is stored in the K memory cells and a second threshold voltage distribution when data is stored in the K memory cells and the L memory cells.

In yet another aspect, a memory system is provided. The memory system comprises a controller and a memory coupled with the controller. The controller is configured to determine an offset voltage value corresponding to a selected word line of N word lines according to a number N of the N word lines and offset voltage information, wherein the N word lines are word lines adjacently disposed in a memory block of the memory, data is stored in K memory cells coupled with the N word lines, K and N are positive integers, and the offset voltage information is used for indicating the offset voltage value corresponding to N. The controller is further configured to send a data read command to the memory, wherein the data read command is used for instructing the memory to generate a read voltage according to the offset voltage value and apply the read voltage to the selected word line. The memory is configured to receive the data read command, and generate the read voltage and apply the read voltage to the selected word line according to the data read command.

In some examples, the controller is further configured to determine the offset voltage value corresponding to the selected word line according to N, location information of the selected word line and the offset voltage information, wherein the location information of the selected word line is used for indicating a location of the selected word line in the N word lines, and the offset voltage information is further used for indicating the offset voltage value corresponding to N and the location information of the selected word line.

In some examples, the selected word line comprises a first selected word line or a second selected word line, the first selected word line comprises a first word line to an (N–1)th word line, and the second selected word line comprises an Nth word line. The controller is further configured to determine a first offset voltage value corresponding to the first selected word line according to N, location information of the first selected word line and the offset voltage information. Alternatively, the controller is further configured to determine a second offset voltage value corresponding to the second selected word line according to N, location information of the second selected word line and the offset voltage information, wherein the first offset voltage value is less than the second offset voltage value.

In some examples, a memory cell of the K memory cells coupled with the selected word line is programmed into a plurality of programming states. The controller is further configured to determine the offset voltage value corresponding to the selected word line according to N, location information of the selected word line, a preset read voltage of a selected memory cell and the offset voltage information, wherein the selected memory cell is the memory cell of the K memory cells coupled with the selected word line, the preset read voltage of the selected memory cell is a read voltage corresponding to a programming state of the selected memory cell, and the offset voltage information is further used for indicating the offset voltage value corresponding to N, the location information of the selected word line, and the preset read voltage of the selected memory cell.

In still another aspect, a computer-readable storage medium is provided. The computer-readable storage medium stores a computer program, and when the computer program is running on a processor, the processor is enabled to execute the operation method of the memory system provided by the foregoing aspect, or to execute the data read method of the memory provided by the foregoing another aspect.

BRIEF DESCRIPTION OF THE DRAWINGS

In order to illustrate the technical solution in the present disclosure more clearly, the drawings to be used in some examples of the present disclosure will be briefly introduced below. Apparently, the drawings in the following description are only drawings of some examples of the present disclosure. Those of ordinary skills in the art may also obtain other drawings according to these drawings. In addition, the drawings in the following description may be regarded as schematic diagrams, instead of limiting an actual size of a product, actual process flow of a method, actual timing of a signal, etc. involved in the examples of the present disclosure.

6

Figure 6A:
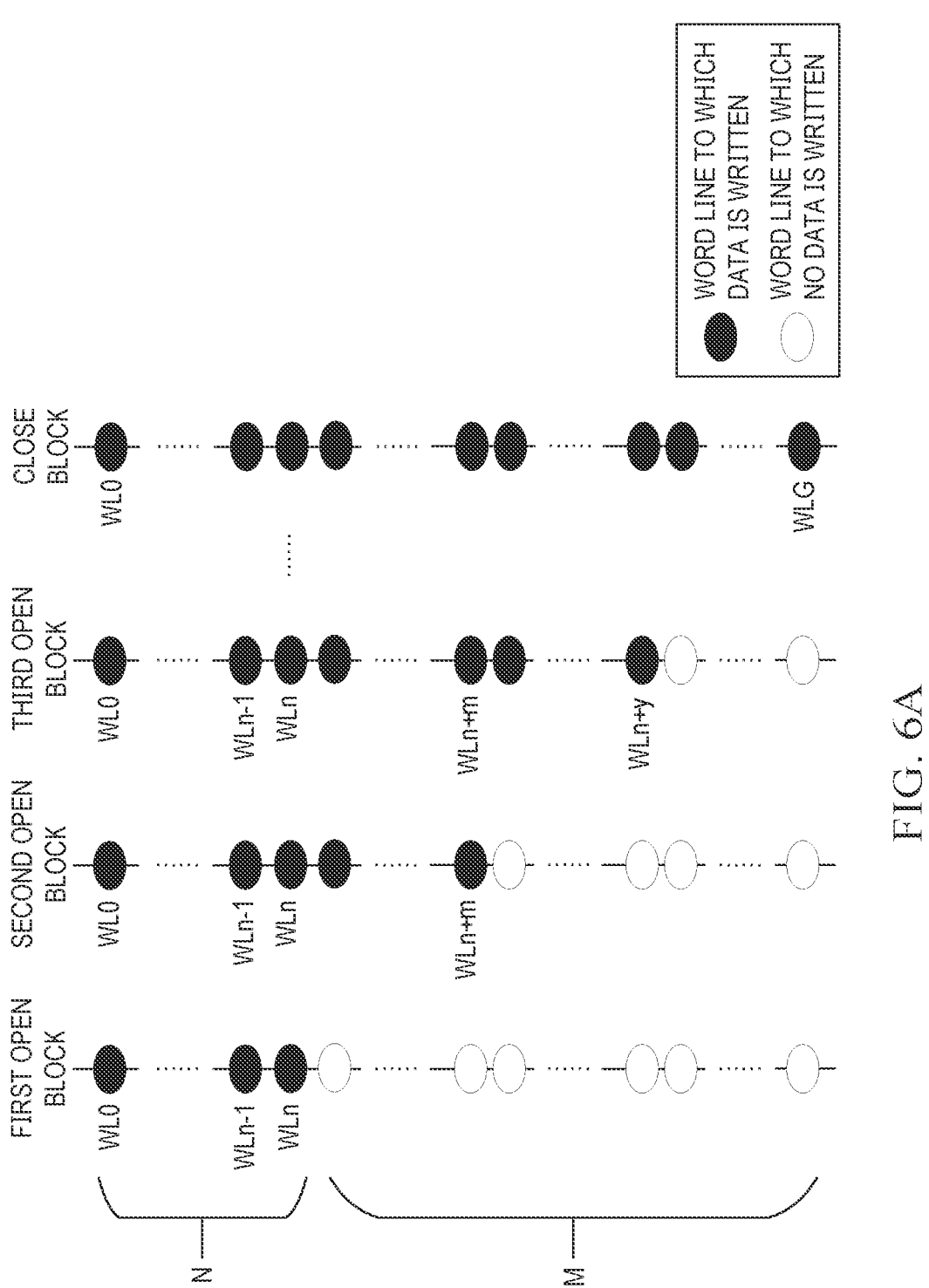
Figure 6B:
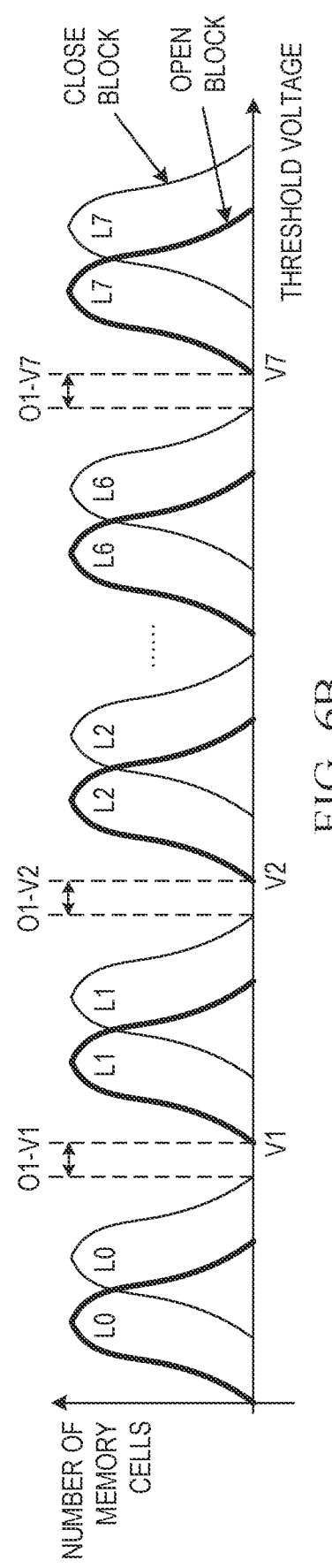
Figure 6C:
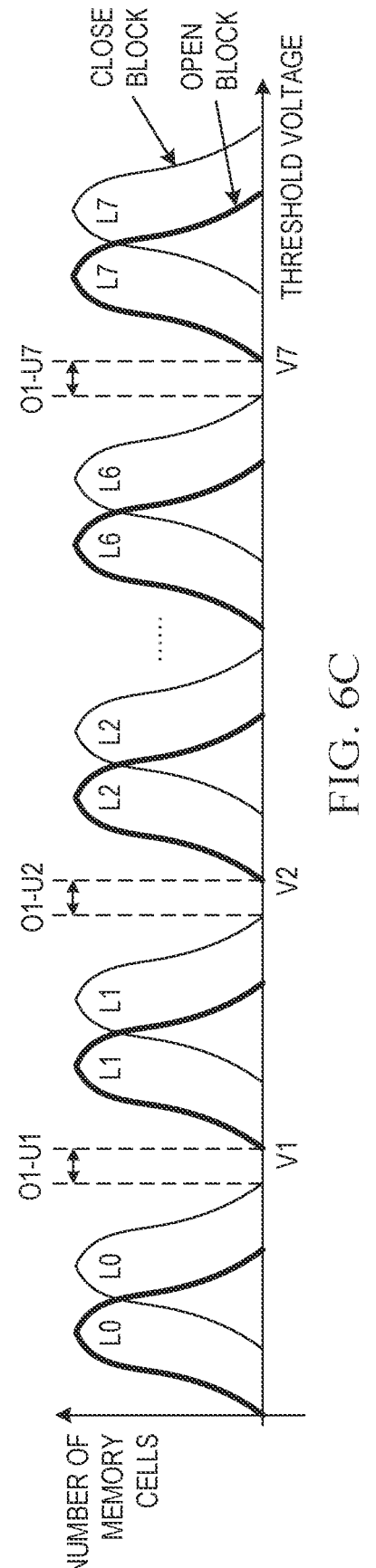

FIGS. 6A, 6B, and 6C (which may be collectively referred to as FIG. 6) are schematic diagrams of another threshold voltage distribution curve according to some examples.

DETAILED DESCRIPTION

The technical features in some examples of the present disclosure will be described below clearly and completely in conjunction with the drawings. Apparently, the examples described are only part of, but not all of, the examples of the present disclosure. All other examples obtained by those of ordinary skills in the art based on the examples provided by the present disclosure should fall in the scope of protection of the present disclosure.

Unless otherwise specified in the context, throughout the specification and the claims, the term "comprise" is interpreted as an open and inclusive meaning, e.g., "including, but not limited to". In the description of the specification, the terms "one example", "some examples", "an example", or "in an example", etc. are intended to indicate that particular features, structures, materials, or characteristics related to the example are included in at least one example of the present disclosure. The schematic representation of the above terms may not necessarily refer to the same example. Furthermore, these particular features, structures, materials, or characteristics may be included in one or more examples in any suitable manner.

In the following, the terms "first" and "second" are only for the purpose of description, and cannot be construed as indicating or implying relative importance or implicitly indicating the number of indicated technical features. Thus, features defined by "first" and "second" may explicitly or implicitly include one or more of such features. In the description of the examples of the present disclosure, "a plurality of" means two or more, unless otherwise stated.

In the description of some examples, the expressions "coupled" and "connected" and derivatives thereof may be used. For example, the term "connected" may be used in the description of some examples to indicate that two or more components have a direct physical contact or an electrical contact with each other. For another example, the term "coupled" may be used in the description of some examples to indicate that two or more components have a direct physical or electrical contact. However, the term "couple" may also mean that two or more components are not in direct contact with each other, but they still cooperate or interact with each other. The examples disclosed herein are not necessarily limited to the content herein.

"At least one of A, B and C" and "at least one of A, B or C" have the same meaning, both including the following combinations of A, B and C: A alone, B along, C alone, a combination of A and B, a combination of A and C, a combination of B and C, and a combination of A, B and C.

"A and/or B" includes the following three combinations: A alone, B alone, and a combination of A and B.

The use of "suitable for" or "configured to" herein means open and inclusive language, and does not exclude an apparatus suitable for performing or configured to perform additional tasks or operations.

In addition, the use of "based on" means openness and inclusiveness, as processes, steps, calculations, or other actions "based on" one or more of the described conditions or values may be based on an additional condition or exceed the described value in practice.

Before the examples of the present disclosure are introduced, the technical terms and background technologies involved in the present disclosure are first introduced.

The term "three-dimensional memory" refers to a semiconductor device formed by memory cell transistor strings (referred to herein as "memory cell strings", e.g., NAND memory cell strings) arranged in an array on a main surface of a substrate or a source layer and extending along a direction perpendicular to the substrate or the source layer. As used herein, the term "vertical/vertically" means nominally perpendicular to the main surface (e.g., a lateral surface) of the substrate or the source layer. A string address is an address corresponding to a "memory cell string". A "selected word line (WL)" is a word line corresponding to a word line address in a read request instruction. An "unselected word line" is a word line other than the word line corresponding to the word line address in the read request instruction.

A "read retry ratio" is a ratio of the number of times of successful data read to the total number of times of attempting to read data within a specific number of times of reading, is one of important indicators for measuring the read performance and stability of a memory, and can reflect reliability and performance of the memory.

A "word line to which data is written" means that data is stored in a memory cell coupled with the word line. For ease of description, the word line is referred to as a word line to which data is written in the examples of the present disclosure.

A "word line to which no data is written" means that data is not stored in a memory cell coupled with the word line. For ease of description, the word line is referred to as a word line to which no data is written in the examples of the present disclosure.

"Dummy data" is often used for the purposes of testing, demonstration, or teaching.

"Single-level cell (SLC)" means each memory cell has only one storage bit, and can only store one data item.

"Multi-level cell (MLC)" means each memory cell has two storage bits, and can store two data items.

"Triple-level cell (TLC)" means each memory cell has three storage bits, and can simultaneously store three data items.

"Quad-level cell (QLC)" means each memory cell has four storage bits, and can simultaneously store four data items.

Figure 1:
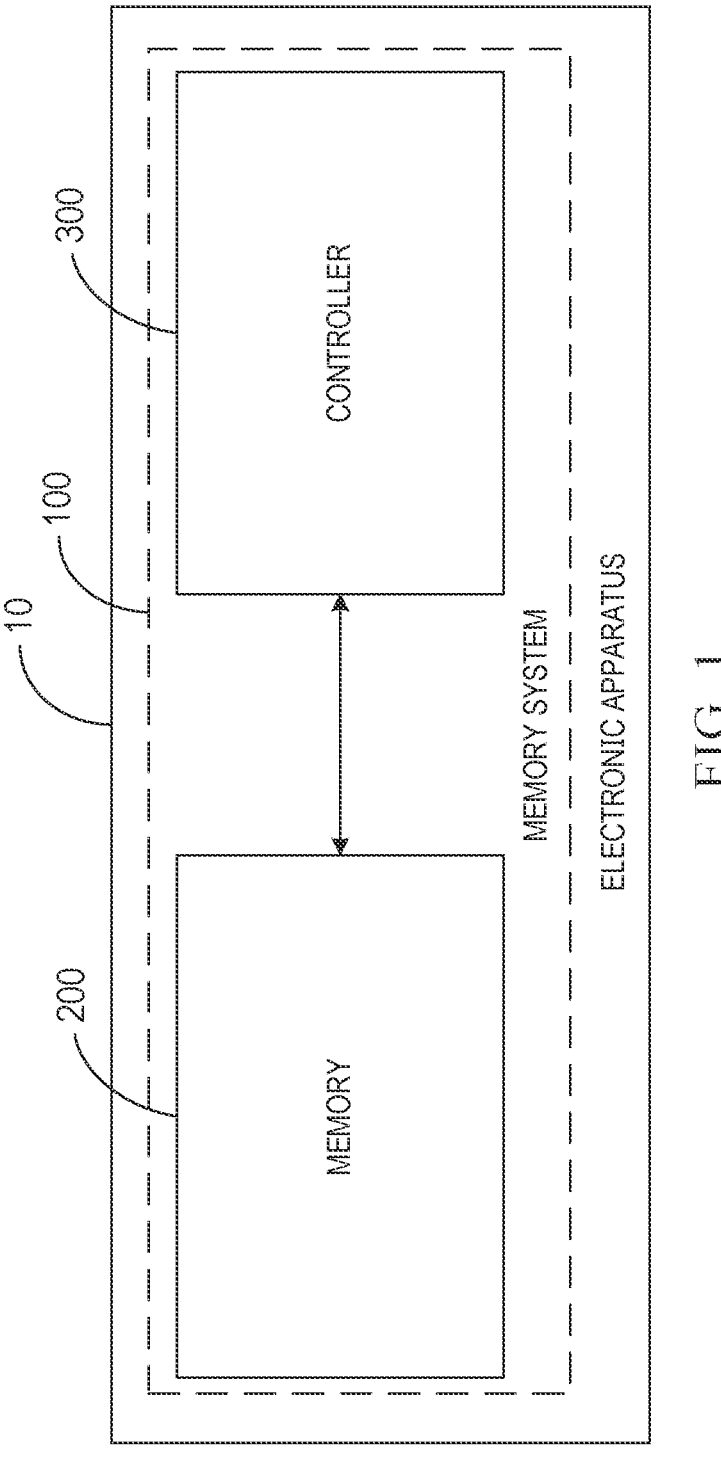
FIG. 1 is a schematic structural diagram of an electronic apparatus according to some examples.

As shown in FIG. 1, a memory system 100 is disposed in an electronic apparatus 10. The memory system 100 comprises a memory 200 and a controller 300. The controller 300 is coupled to the memory 200, and data may be read or written from or to the memory 200 through the controller 300.

It may be understood that, the memory system 100 may comprise the controller 300 and one or more memories 200. For example, in one example, the controller 300 and a single memory 200 may be integrated into a memory card. The memory card may comprise a Personal Computer Memory Card International Association (PCMCIA, PC) card, a Compact Flash (CF) card, a Smart Media (SM) card, a memory stick, a Multimedia card (MMC), a Secure Digital (SD) card, a Universal Flash Storage (UFS), and the like. The Multimedia card may be categorized into an MMC, a reduced-size MMC (RS-MMC), a micro MMC (MMCmicro), etc. The Secure Digital card includes an SD, a mini SD (miniSD), a micro SD (microSD), a High Capacity Secure Digital card (SDHC), etc. Further, the memory card may also comprise a memory card connector coupling the memory card with a host.

In another example, the controller 300 and a plurality of memories 200 may be integrated into a solid state disk (SSD). The SSD may further comprise an SSD connector coupling the SSD with the host. In some implementations, the storage capacity and/or operating speed of the SSD are greater than the storage capacity and/or operating speed of the memory card. In addition, the above-mentioned electronic apparatus may be any one of a cellphone, a desktop computer, a tablet computer, a laptop computer, a server, a vehicle apparatus, a wearable apparatus (for example, a smart watch, a smart bracelet, smart glasses, etc.), a mobile power supply, a game console, a digital multimedia player, etc., which is not limited in the examples of the present disclosure.

Figure 2:
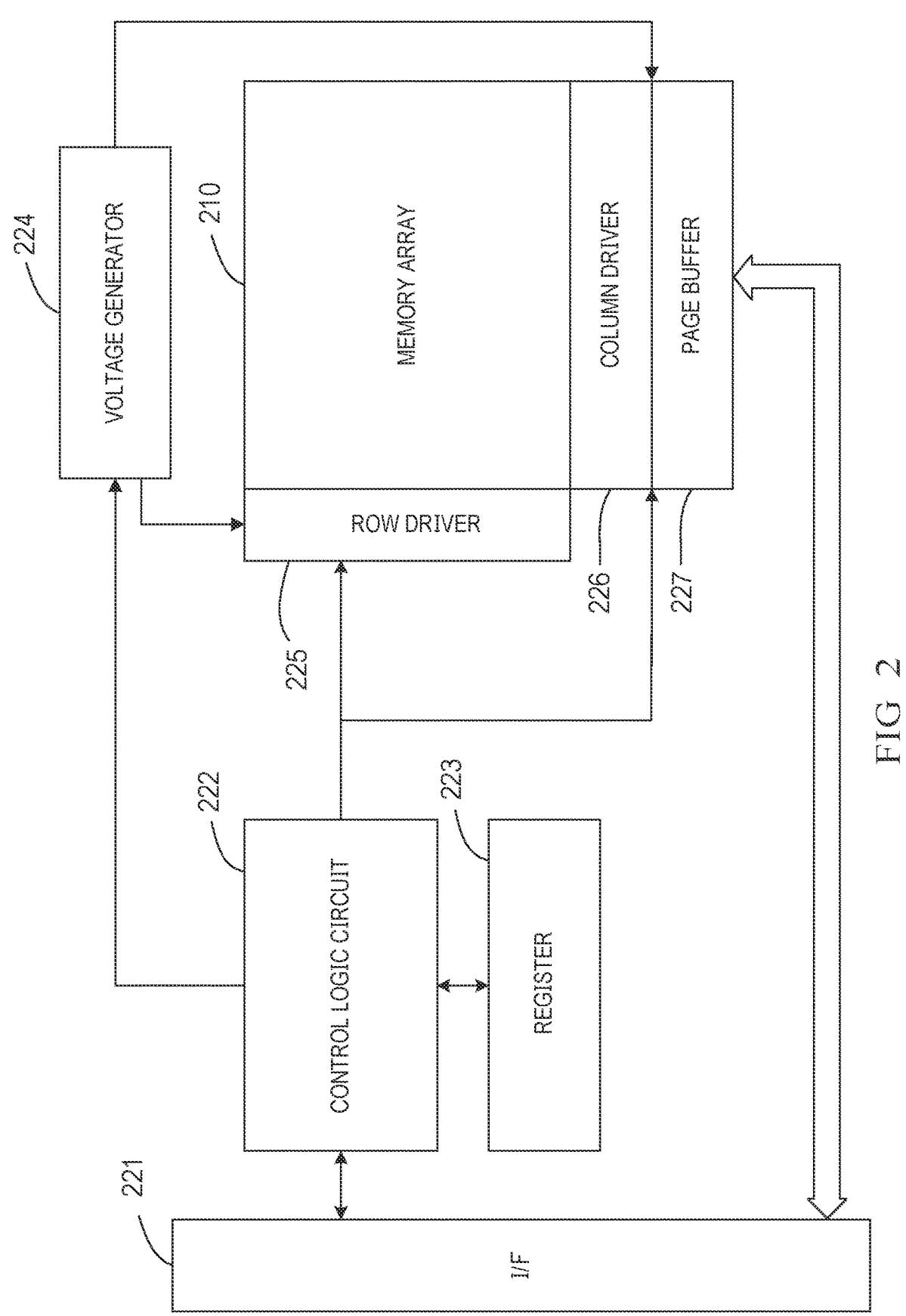
FIG. 2 is a schematic structural diagram of a memory according to some examples.

As shown in FIG. 2, the memory 200 comprises a memory array 210 and a peripheral circuit. The peripheral circuit comprises an interface 221, a control logic circuit 222, a register 223, a voltage generator 224, a row driver 225, a column driver 226, and a page buffer 227, etc.

The interface 221 is mainly used to receive a read instruction and a write instruction sent by the controller 300, and send read data to the controller 300, etc. The control logic circuit 222 is mainly used to control the row driver 225 to connect the voltage generator 224 with a corresponding word line according to the received read instruction, and control the column driver 226 to connect the voltage generator 224 with a corresponding bit line (BL), so as to read corresponding data. The register 223 comprises an address register, a state register, etc. The address register is used to store a word line address, and a string address, etc. in a read request instruction. The state register is used to store a current state of the memory, including a ready state and a busy state. When the control logic circuit 222 is reading or writing data from or to the memory array 210, the state stored in the state register is a "busy" state, and a next read or write operation cannot be performed. When the memory array 210 completes a read process or a write process, the state stored in the state register is switched to a "ready" state, and a next read or write operation may be performed. The page buffer 227 comprises a first register and a second register, wherein the first register is used to buffer data read from the memory array 210, and the second register is used to buffer data transferred from the first register.

Figure 3:
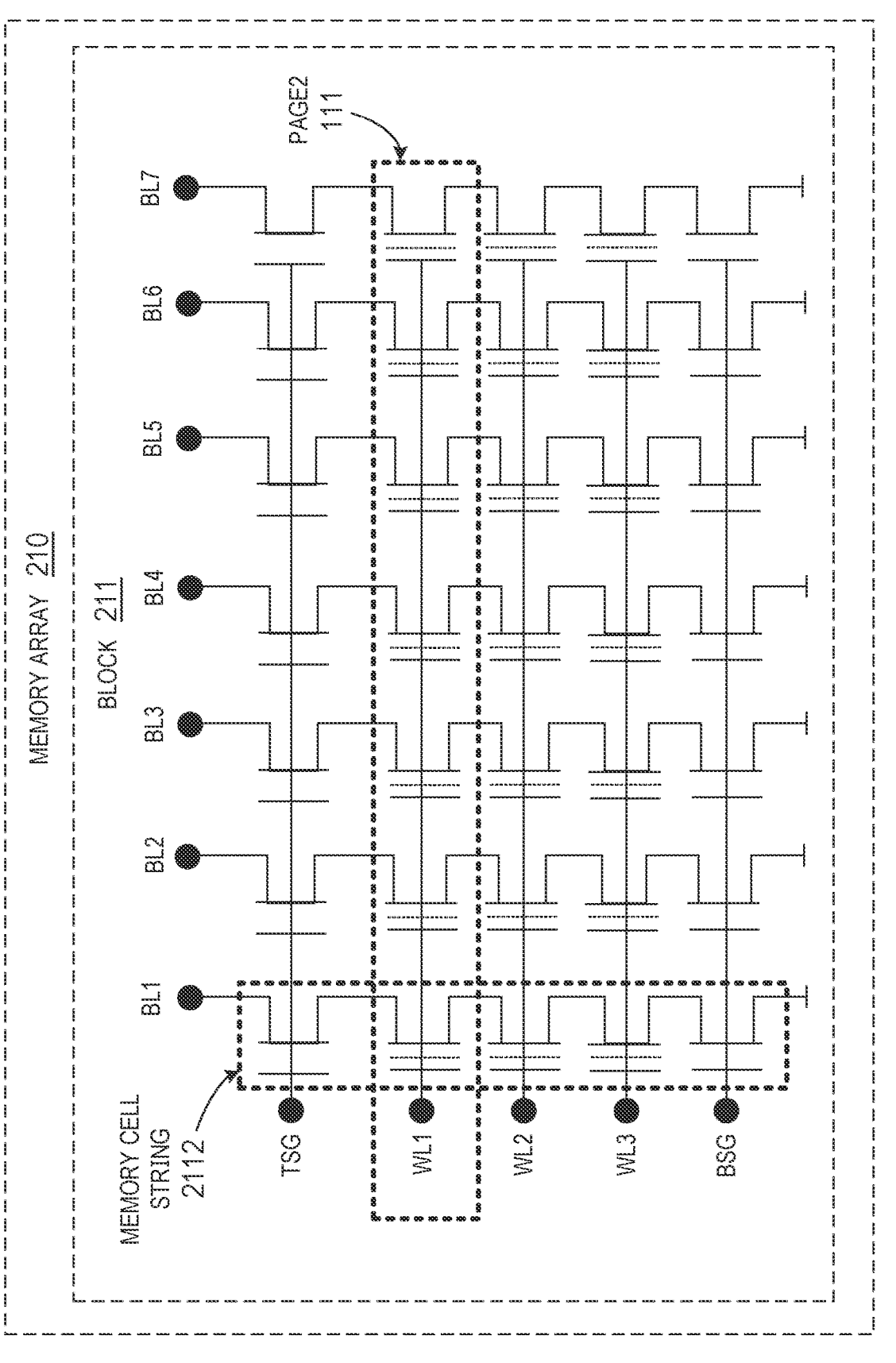
FIG. 3 is a schematic structural diagram of a memory array according to some examples.

The memory array 210 in the memory 200 may comprise a plurality of memory cells arranged at intersections of word lines and bit lines. According to a structural difference of the memory array 210, the memory may be divided into a two-dimensional memory and a three-dimensional memory. As shown in FIG. 3, FIG. 3 is a schematic structural diagram of a memory array 210 in a three-dimensional memory. The memory array 210 comprises word lines WL1-WL3 and bit lines BL1-BL7. A plurality of memory cells that are on each word line and are perpendicular to each bit line form one page 2111. A plurality of memory cells that are on each bit line and are perpendicular to each word line form one memory cell string 2112. A top selective gate (TSG) is disposed at the top of each memory cell string 2112, and a bottom selective gate (BSG) is disposed at the bottom of each memory cell string 2112. A plurality of memory cell strings 2112 may be disposed on each bit line, and each word line may be coupled with memory cells in the plurality of memory cell strings 2112. A difference between the two-dimensional memory and the three-dimensional memory lies in that the memory cell string 2112 in the two-dimensional memory perpendicular to each bit line only has one memory cell.

A minimum unit of programming in the NAND flash memory is a page, and a memory cell in one page is used as an example. When data needs to be stored into the memory cell, a turned-on voltage may be inputted to the top selective gate (TSG) and the bottom selective gate (BSG) separately, so as to turn on the top selective gate and the bottom selective gate, then a program voltage is applied to a word line coupled with the memory cell, and a program permission voltage is applied to a bit line coupled with the memory cell, so that a threshold voltage (Vth) of the memory cell may be programmed to achieve storage of information. When data needs to be read from the memory cell, a turned-on voltage may be inputted to the top selective gate and the bottom selective gate separately, so as to turn on the top selective gate and the bottom selective gate, then a read voltage is applied to the word line coupled with the memory cell, and a turned-on voltage is applied to the bit line coupled with the memory cell, so that reading of information can be achieved.

As requirement for storage capacity of a memory continues increasing, the memory continues developing toward a smaller device size. For example, in a memory array of a 3D NAND flash memory, the thickness of each layer of word lines becomes increasingly smaller, and a spacing between the layers of word lines becomes increasingly smaller. At the same time, the memory continues developing toward more stacked layers, which leads to an increasingly severe capacitance coupling effect and a back pattern dependency (BPD) effect. This will cause an offset between a threshold voltage distribution of memory cells in an open block of the 3D NAND flash memory and a threshold voltage distribution of memory cells in a close block, which results in an increased read retry ratio, degraded read performance, and poor user experience during reading of data from the memory cell in the open block.

For example, a memory cell in one memory block as a triple-level cell (TLC) is taken as an example. As shown in (a) of FIG. 4, when all word lines in the memory block are word lines to which data is written, it may be understood that the data is written to all pages in the memory block at this time, and the memory block may be referred to as a close block. Due to a strong capacitance coupling effect between the word lines to which the data is written in the close block and a strong back pattern dependency effect, charge variations between various memory cells in the close block can cancel out each other. Thus an offset of the threshold voltage distribution of the memory cell in the close block is small; in other words, an initial threshold voltage shift (IVS) is small. A threshold voltage distribution curve of the memory cell in the close block is a close block curve shown in (b) of FIG. 4.

Figure 4A:
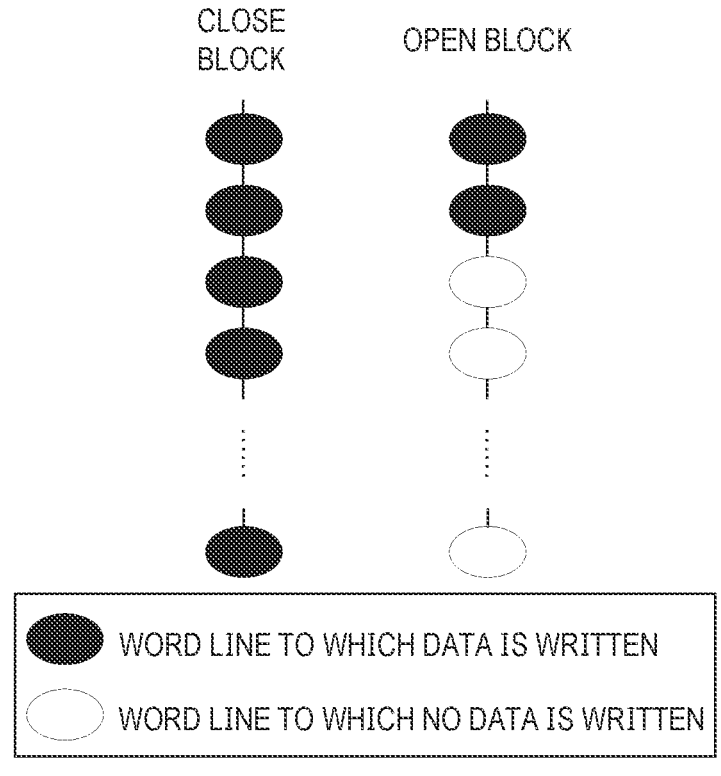
FIGS. 4A and 4B (which may be collectively referred to as FIG. 4) are a schematic diagrams of a threshold voltage distribution curve according to some examples.
Figure 4B:
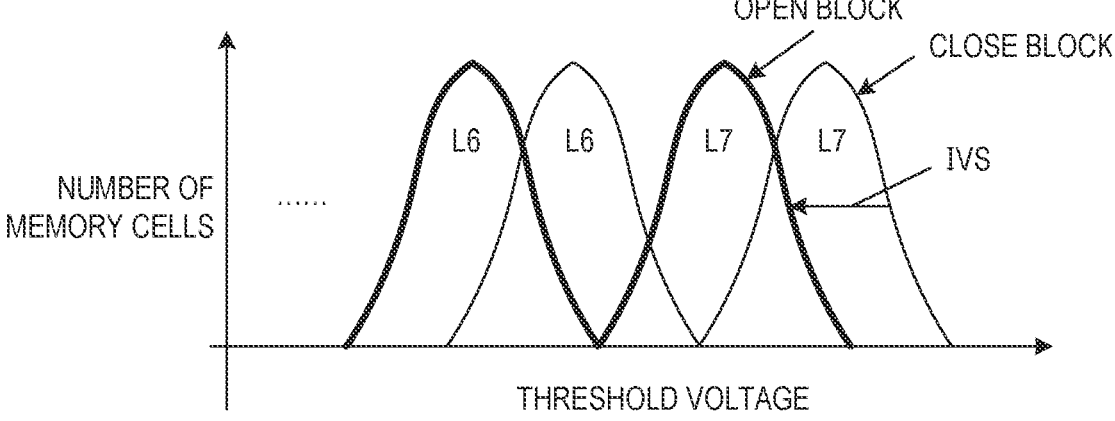

As shown in (a) of FIG. 4, when some word lines in the memory block are word lines to which the data is written and the remaining word lines are word lines to which no data is written, it may be understood that the data is written to some pages in the memory block at this time, and the memory block may be referred to as an open block. Due to a weak capacitance coupling effect between the word lines to which data is written in the open block and a weak back pattern dependency effect, charge variations between various memory cells in the open block cannot cancel out each other, which results in a large offset of the threshold voltage distribution of the memory cell in the open block. A threshold voltage distribution curve of the memory cell in the open block is an open block curve shown in (b) of FIG. 4.

"L6" and "L7" shown in (b) of FIG. 4 represent different programming states. The two programming states are used as an example for illustrative description in (b) of FIG. 4. According to the close block curve and the open block curve, it may be understood that, compared with threshold voltage distributions of the memory cell in the close block in various programming states, threshold voltage distributions of the memory cell in the open block each have certain offsets in various corresponding programming states, which results in an increased read retry ratio, degraded read performance, and poor user experience during the reading of the data from the memory cell in the open block.

To address this, when the memory block is an open block, dummy data may be written to a memory cell coupled with the word line to which no data is written to transform the memory block into a close block, so as to enhance the capacitance coupling effect and the back pattern dependency effect between the word lines in the memory block, so that charge variations between various memory cells in the memory block can cancel out each other, the offset of the threshold voltage distribution is reduced, the read retry ratio is reduced, and the read performance is improved. However, the writing of dummy data into the open block will lead to higher power consumption of the memory.

It is found through experimental tests that the offset of the threshold voltage distribution of the memory cell in the memory block is related to the number of word lines to which the data is written in the memory block. To address this, examples of the present disclosure provide an operation method of a memory system and a data read method of a memory. In the two methods, an offset voltage value corresponding to a selected word line in a memory block is determined according to the number of word lines to which data is written in the memory block, and a read voltage is applied to the selected word line according to the offset voltage value, so that a read retry ratio of the memory can be reduced, and read performance can be improved, so as to improve user experience. The two methods may be applied to the above-mentioned memory system 100, the examples of the present disclosure are illustrated by way of an example in which the method is applied to the above-mentioned memory system 100.

Figure 5:
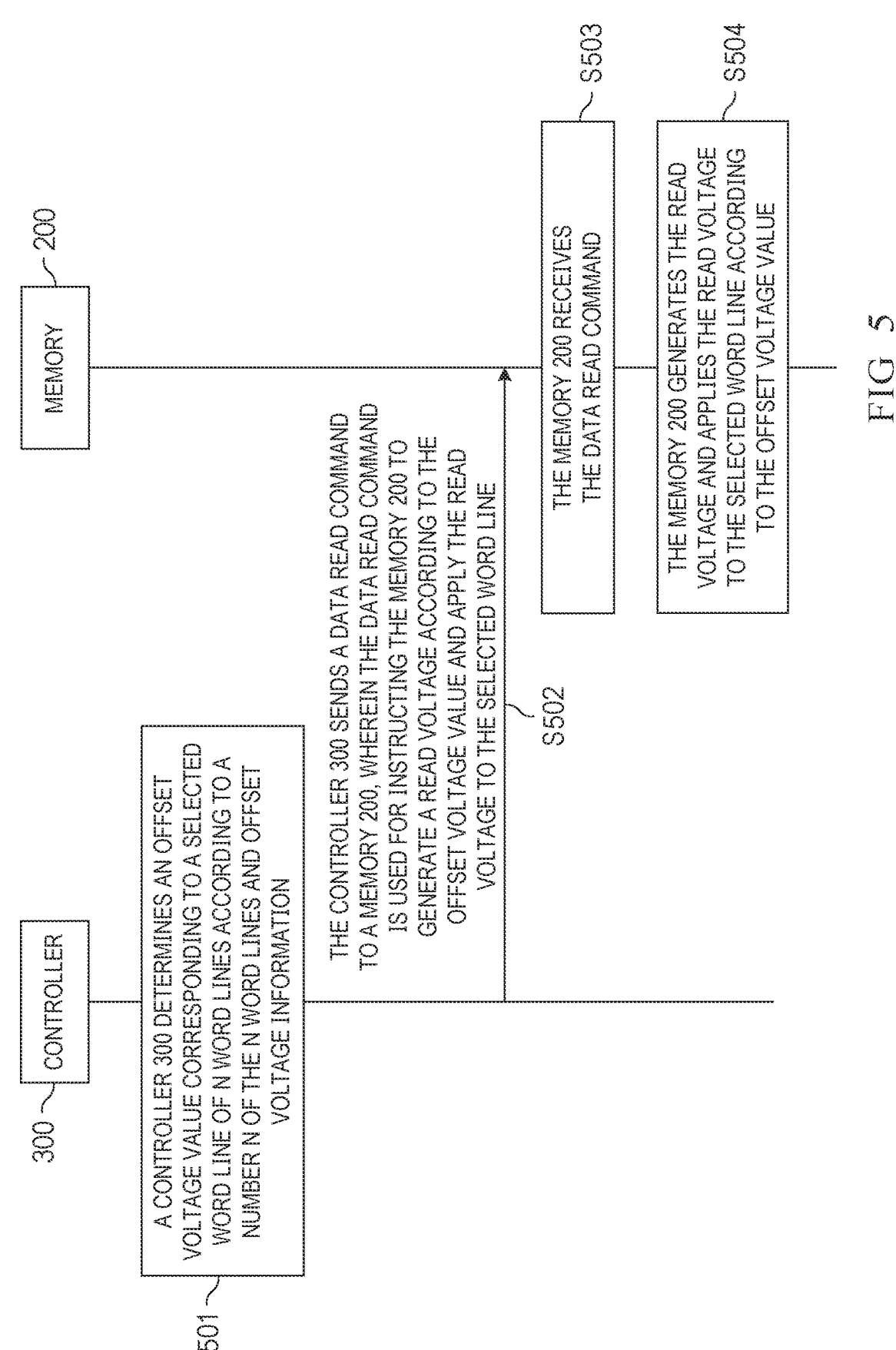
FIG. 5 is a flow diagram of an operation method of a memory system according to some examples.

As shown in FIG. 5, FIG. 5 is a flow diagram of an operation method of a memory system and a data read method of a memory provided by examples of the present disclosure. The method comprises operations S501-S504.

S501: Determining, by a controller 300, an offset voltage value corresponding to a selected word line of N word lines according to a number N of the N word lines and offset voltage information. The N word lines are word lines that are adjacently disposed in a memory block of the memory 200, and data is stored in K memory cells coupled with the N word lines, and K and N are positive integers. Specific values of N and K are not limited in the examples of the present disclosure. It may be understood that the N word lines are word lines to which data is written. The offset voltage information is used for indicating the offset voltage value corresponding to N.

In an example, the above offset voltage information may be in a table form, or may be in other forms, which is not limited in the examples of the present disclosure. The table form is used as an example in the following examples of the present disclosure for illustrative description.

In an example, the offset voltage information may be as shown in Table 1 below. As can be seen from Table 1, a different number of N word lines corresponds to one respective offset voltage value. For example, when the N word lines comprise 1 word line, it corresponds to an offset voltage value of 0.2. When the N word lines comprise 2 word lines, it corresponds to an offset voltage value of 0.1. In this way, the offset voltage value corresponding to the selected word line of the N word lines may be determined according to the number N of the N word lines and Table 1.

TABLE 1

| Number of N word lines | Offset voltage value |
| --- | --- |
| 1 | 0.2 |
| 2 | 0.1 |
| . . . | . . . |

In an example, the above-mentioned selected word line may be one of the N word lines, or may be a plurality of word lines of the N word lines, which is not limited in the examples of the present disclosure.

For example, when taking the N word lines comprising 10 word lines as an example, the selected word line may be 1 word line of the 10 word lines, or may be 3 word lines of the 10 word lines.

In an example, the type of the above-mentioned K memory cells includes at least one of a single-level cell, a multi-level cell, a triple-level cell, and a quad-level cell, which is not limited in the examples of the present disclosure.

It is found through experimental tests that when the selected word line is located at different locations in the N word lines, threshold voltage offsets of memory cells coupled with the selected word lines are different. The controller 300 determines a corresponding offset voltage value according to location information of the selected word line in the N word lines, so that the accuracy of the offset voltage value can be further improved. The memory 200 applies a read voltage to the selected word line according to the offset voltage value, so that the read retry ratio can be further reduced, and the read performance can be further improved.

In one possible example, determining, by the controller 300, the offset voltage value corresponding to the selected word line of the N word lines according to the number N of the N word lines and the offset voltage information comprises: determining, by the controller 300, the offset voltage value corresponding to the selected word line according to N, the location information of the selected word line and the offset voltage information, wherein the location information of the selected word line is used for indicating a location of the selected word line in the N word lines, and the offset voltage information is further used for indicating the offset voltage value corresponding to N and the location information of the selected word line.

In an example, the selected word line may comprise a first selected word line or a second selected word line, the first selected word line comprises a first word line to an (N−1)th word line, and the second selected word line comprises an Nth word line. Determining, by the controller 300, the offset voltage value corresponding to the selected word line according to N, the location information of the selected word line and the offset voltage information comprises: determining, by the controller 300, a first offset voltage value corresponding to the first selected word line according to N, location information of the first selected word line and the offset voltage information, or determining, by the controller 300, a second offset voltage value corresponding to the second selected word line according to N, location information of the second selected word line and the offset voltage information, wherein the first offset voltage value is less than the second offset voltage value.

In an example, when the offset voltage information is further used for indicating the offset voltage value corresponding to N and the location information of the selected word line, the offset voltage information may be as shown in Table 2. As can be seen from Table 2, when the N word lines comprise different numbers of word lines and the selected word line is located at different locations in the N word lines, the selected word line corresponds to different offset voltage values.

For example, in conjunction with (a) of FIG. 6, the memory block comprising G word lines with G being a positive integer greater than or equal to N is taken as an example.

When n word lines of the G word lines are word lines to which data is written, with n being a positive integer, the memory block may be referred to as a first open block. The number of the above-mentioned N word lines is n. The first selected word line comprises a first word line WL0 to an (N−1)th word line WLn−1, and the second selected word line comprises an Nth word line WLn. As can be seen from Table 2, an offset voltage value corresponding to the first selected word line is O1, and an offset voltage value corresponding to the second selected word line is O1'.

When n+m word lines of the G word lines are word lines to which data is written, with m being a positive integer, the memory block may be referred to as a second open block. The number of the above-mentioned N word lines is n+m. The first selected word line comprises a first word line WL0 to an (N−1)th word line WLn+m−1, and the second selected word line comprises an Nth word line WLn+m. As can be seen from Table 2, an offset voltage value corresponding to the first selected word line is O2, and an offset voltage value corresponding to the second selected word line is O2'.

When n+y word lines of the G word lines are word lines to which data is written, with y being a positive integer and greater than m, the memory block may be referred to as a third open block. The number of the above-mentioned N word lines is n+y. The first selected word line comprises a first word line WL0 to an (N−1)th word line WLn+y−1, and the second selected word line comprises WLn+y. As can be seen from Table 2, an offset voltage value corresponding to the first selected word line is O3, and an offset voltage value corresponding to the second selected word line is O3'.

When all word lines of the G word lines are word lines to which data is written, the memory block may be referred to as a close block. The number of the above-mentioned N word lines is G. The first selected word line comprises a first word line WL0 to an (N−1)th word line WLG−1, and the second selected word line comprises WLG. As can be seen from Table 2, offset voltage values corresponding to the first selected word line and the second selected word line are both 0.

TABLE 2

| Number of N word lines | Selected word line | Offset voltage value |
| --- | --- | --- |
| n | WL0 – WLn – 1 | O1 |
|  | WLn | O1' |
| n + m | WL0 – WLn + m – 1 | O2 |
|  | WLn + m | O2' |
| n + y | WL0 – WLn + y – 1 | O3 |
|  | WLn + y | O3' |
| G | WL0 – WLG | 0 |

In an example, the first selected word line comprises one of the first word line to the (N−1)th word line, or comprises a plurality of word lines of the first word line to the (N−1)th word line, which is not limited in the examples of the present disclosure.

It is found through experimental tests that when the memory cell coupled with the selected word line is programmed into different programming states, the threshold voltage offsets of the memory cell are different. The controller 300 determines a corresponding offset voltage value according to preset read voltages corresponding to various programming states of the memory cell, so that the accuracy of the offset voltage value can be further improved. The memory 200 applies a read voltage to the selected word line according to the offset voltage value, so that the read retry ratio can be further reduced, and the read performance can be further improved.

In one possible example, a memory cell of the K memory cells coupled with the selected word line is programmed into a plurality of programming states. Determining, by the above-mentioned controller 300, the offset voltage value corresponding to the selected word line of the N word lines according to the number N of the N word lines and the offset voltage information comprises: determining the offset voltage value corresponding to the selected word line according to N, location information of the selected word line, a preset read voltage of a selected memory cell and the offset voltage information. The selected memory cell is the memory cell of the K memory cells coupled with the selected word line, the word line. The first selected word line comprises a first word line WL0 to an (N−1)th word line WLn−1. The selected memory cell is a memory cell that is coupled with the first selected word line and is programmed into the second programming state. When a preset read voltage of the selected memory cell is V1, as can be seen from Table 3, the offset voltage value corresponding to the selected word line is O1-V1 at this time.

When n word lines of the G word lines are word lines to which data is written, the selected word line is a second selected word line. The second selected word line comprises an Nth word line WLn. The selected memory cell is a memory cell that is coupled with the second selected word line and is programmed into the fifth programming state. When a preset read voltage of the selected memory cell is V4, as can be seen from Table 3, the offset voltage value corresponding to the selected word line is O1-U4 at this time.

It may be understood that, when the number N of selected word lines is n+m, n+y or G, the selected word lines are first selected word lines or second selected word lines, the selected memory cell is a memory cell that is coupled with the selected word line and is programmed into any programming state, and the selected memory cell corresponds to any preset read voltage, according to Table 3, a corresponding offset voltage value may be determined, which is no longer repeated in the examples of the present disclosure herein.

TABLE 3

| Number of N word lines | Selected word line | V1 | V2 | V3 | V4 | V5 | V6 | V7 |
|---|---|---|---|---|---|---|---|---|
| n | WL0-WLn-1 | O1-V1 | O1-V2 | O1-V3 | O1-V4 | O1-V5 | O1-V6 | O1-V7 |
|  | WLn | O1-U1 | O1-U2 | O1-U3 | O1-U4 | O1-U5 | O1-U6 | O1-U7 |
| n + m | WL0-WLn-1 | O2-V1 | O2-V2 | O2-V3 | O2-V4 | O2-V5 | O2-V6 | O2-V7 |
|  | WLn + m | O2-U1 | O2-U2 | O2-U3 | O2-U4 | O2-U5 | O2-U6 | O2-U7 |
| n + y | WL0-WLn + y | O3-V1 | O3-V2 | O3-V3 | O3-V4 | O3-V5 | O3-V6 | O3-V7 |
|  | WLn + y | O3-U1 | O3-U2 | O3-U3 | O3-U4 | O3-U5 | O3-U6 | O3-U7 |
| G | WL0-WLG | 0 | 0 | 0 | 0 | 0 | 0 | 0 | preset read voltage of the selected memory cell is a read voltage corresponding to a programming state of the selected memory cell, and the offset voltage information is further used for indicating the offset voltage value corresponding to N, the location information of the selected word line, and the preset read voltage of the selected memory cell.

In an example, when the offset voltage information is further used for indicating the offset voltage value corresponding to N, the location information of the selected word line, and the preset read voltage of the selected memory cell, the offset voltage information may be as shown in Table 3. As can be seen from Table 3, when the memory cell coupled with the selected word line is programmed into different programming states, which correspond to different preset read voltages, the selected word line corresponds to different offset voltage values.

For example, in conjunction with (a) of FIG. 6, the memory block comprises G word lines, a memory cell coupled with the G word lines is a triple-level cell, and the memory cell coupled with the G word lines may be programmed into 8 programming states. Except a first programming state being an erase state, preset read voltages corresponding to a second programming state to an eighth programming state are V1 to V7 respectively.

When n word lines of the G word lines are word lines to which data is written, the selected word line is a first selected In an example, the selected memory cell may be one memory cell coupled with the selected word line, or may be a plurality of memory cells coupled with the selected word line, which is not limited in the examples of the present disclosure.

In one possible example, the memory block further comprises M word lines that are disposed adjacent to the N word lines, and L memory cells that are coupled with the M word lines, wherein the M word lines are disposed adjacently, data is not stored in the L memory cells, M is an integer greater than or equal to 0, and L is a positive integer. Specific values of M and L are not limited in the examples of the present disclosure.

For example, when M is equal to 0, the memory block comprises N word lines, the N word lines are all word lines to which data is written, and the memory block may be referred to as a close block. When M is greater than 0, the memory block comprises N+M word lines. The N word lines are word lines to which data is written, the M word lines are word lines to which no data is written, and the memory block may be referred to as an open block.

The above offset voltage information is determined according to a comparison between a first threshold voltage distribution when data is stored in the K memory cells and a second threshold voltage distribution when data is stored in the K memory cells and the L memory cells. It may be understood that, when M is equal to 0, the offset voltage information is determined according to a comparison of the first threshold voltage distribution when the memory block is a close block and the second threshold voltage distribution when the memory block is a close block. When M is greater than 0, the offset voltage information is determined according to a comparison of the first threshold voltage distribution when the memory block is an open block and the second threshold voltage distribution when the memory block is a close block.

The examples of the present disclosure are illustrated by taking determining of the offset voltage information in Table 3 as an example. A process of determining the remaining offset voltage information may be referred to the following description, which is no longer repeated herein in the examples of the present disclosure.

For example, as an example shown in (a) of FIG. 6, the memory block comprises G word lines, G=N+M, M is greater than 0, the memory block is a first open block, the number of N is n, and the memory cell coupled with the G word lines is a triple-level cell.

A threshold voltage distribution curve of the memory cells coupled with the first word line WL0 to the (N−1)th word line WLn−1 is an open block curve as shown in (b) of FIG. 6, and a threshold voltage distribution curve of the memory cell coupled with the Nth word line WLn is an open block curve as shown in (c) of FIG. 6. It may be understood that the two open block curves are curves corresponding to the first threshold voltage distribution when data is stored in the K memory cells.

When all word lines of the G word lines are word lines to which data is written, a threshold voltage distribution curve of the memory cell coupled with the G word lines is a close block curve as shown in (b) of FIG. 6, or a close block curve as shown in (c) of FIG. 6. It may be understood that the two close block curves are curves corresponding to the second threshold voltage distribution when data is stored in the K memory cells and the L memory cells.

L0 to L7 represent different programming states, and V1 to V7 represent preset read voltages corresponding to the memory cell in various programming states.

As can be seen from (b) of FIG. 6 and (c) of FIG. 6, through a comparison of the close block curve and the open block curve, offset voltage values corresponding to a selected memory cell that is coupled to with selected word line and is programmed into any programming state when the selected word line is located at different locations in the N word lines may be determined. For example, according to (b) of FIG. 6, it may be determined that the offset voltage value corresponding to the selected word line is O1-V1 when the selected word line is the first word line WL0 of the N word lines, a memory cell coupled with the first word line WL0 is programmed to the programming state of L1 and a corresponding preset read voltage is V1. According to the curve corresponding to the first threshold voltage distribution and the curve corresponding to the second threshold voltage distribution, a specific process of determining the above offset voltage information may be referred to the above description, which is no longer repeated herein in the examples of the present disclosure.

In one possible example, the above-mentioned offset voltage information may be stored in the controller 300.

S502: Sending, by the controller 300, a data read command to the memory 200, wherein the data read command is used for instructing the memory 200 to generate a read voltage according to the offset voltage value and apply the read voltage to the selected word line.

S503: Receiving, by the memory 200, the data read command.

S504: Generating, by the memory 200, the read voltage and applying the read voltage to the selected word line according to the data read command.

In the operation method of the memory system and the data read method of the memory provided by the examples of the present disclosure, the offset voltage value corresponding to the selected word line of N word lines is first determined according to the number N of the N word lines and the offset voltage information, wherein the N word lines are word lines adjacently disposed in the memory block of the memory 200, and the data is stored in the K memory cells coupled with the N word lines. It may be understood that for the offset voltage value determined in the examples of the present disclosure, it is taken into consideration that an offset of a threshold voltage of a memory cell in the memory block is different when the number of word lines in the memory block to which the data is written is different. Thus, the offset voltage value determined in the examples of the present disclosure is more accurate, and a read voltage determined based on the offset voltage value is more accurate, so that the read retry ratio of the memory 200 can be reduced, and the read performance can be improved. At the same time, compared with the solution in which dummy data is written to an open block, power consumption of the memory 200 can be reduced.

Examples of the present disclosure further provide a memory system. The memory system comprises a controller and a memory coupled with the controller. A structure of the memory system may be a structure of the memory system 100 as shown in FIG. 1. The examples of the present disclosure are illustrated by taking the structure of the memory system as the structure of the memory system 100 as an example.

The controller 300 is configured to determine an offset voltage value corresponding to a selected word line of N word lines according to a number N of the N word lines and offset voltage information, wherein the N word lines are word lines adjacently disposed in a memory block of the memory, data is stored in K memory cells coupled with the N word lines, and K and N are positive integers. Specific values of N and K are not limited in the examples of the present disclosure. The offset voltage information is used for indicating the offset voltage value corresponding to N.

In an example, the above-mentioned offset voltage information may be in a table form, or may be in other forms, which is not limited in the examples of the present disclosure.

In an example, the above-mentioned selected word line may be one of the N word lines, or may be a plurality of word lines of the N word lines, which is not limited in the examples of the present disclosure.

In an example, the type of the above-mentioned K memory cells includes at least one of a single-level cell, a multi-level cell, a triple-level cell, and a quad-level cell, which is not limited in the examples of the present disclosure.

The controller 300 is further configured to send a data read command to the memory 200. The data read command is used for instructing the memory 200 to generate a read voltage according to the offset voltage value and apply the read voltage to the selected word line.

The controller 300 is configured to receive the data read command, and generate the read voltage and apply the read voltage to the selected word line according to the data read command.

In one possible example, the controller 300 is further configured to determine the offset voltage value corresponding to the selected word line according to N, location information of the selected word line and the offset voltage information, wherein the location information of the selected word line is used for indicating a location of the selected word line in the N word lines, and the offset voltage information is further used for indicating the offset voltage value corresponding to N and the location information of the selected word line.

In one possible example, the above-mentioned selected word line comprises a first selected word line or a second selected word line, the first selected word line comprises a first word line to an (N–1)th word line, and the second selected word line comprises an Nth word line.

The controller 300 is further configured to determine a first offset voltage value corresponding to the first selected word line according to N, location information of the first selected word line and the offset voltage information.

Alternatively, the controller 300 is further configured to determine a second offset voltage value corresponding to the second selected word line according to N, location information of the second selected word line and the offset voltage information, wherein the first offset voltage value is less than the second offset voltage value.

In an example, the first selected word line comprises one of the first word line to the (N–1)th word line, or comprises a plurality of word lines of the first word line to the (N–1)th word line, which is not limited in the examples of the present disclosure.

In one possible example, a memory cell of the K memory cells coupled with the selected word line is programmed into a plurality of programming states. The controller 300 is further configured to determine the offset voltage value corresponding to the selected word line according to N, location information of the selected word line, a preset read voltage of a selected memory cell and the offset voltage information, wherein the selected memory cell is the memory cell of the K memory cells coupled with the selected word line, the preset read voltage of the selected memory cell is a read voltage corresponding to a programming state of the selected memory cell, and the offset voltage information is further used for indicating the offset voltage value corresponding to N, the location information of the selected word line, and the preset read voltage of the selected memory cell.

In an example, the selected memory cell may be one memory cell coupled with the selected word line, or may be a plurality of memory cells coupled with the selected word line, which is not limited in the examples of the present disclosure.

In the memory system provided by the examples of the present disclosure, the offset voltage value corresponding to the selected word line of the N word lines is determined according to the number N of the N word lines and the offset voltage information, wherein the N word lines are word lines adjacently disposed in the memory block of the memory 200, and data is stored in the K memory cells coupled with the N word lines. It may be understood that, for the offset voltage value determined in the examples of the present disclosure, it is taken into consideration that an offset of a threshold voltage of a memory cell in the memory block is different when the number of word lines in the memory block to which the data is written is different. Thus, the offset voltage value determined in the examples of the present disclosure is more accurate, and a read voltage determined based on the offset voltage value is more accurate, so that the read retry ratio of the memory 200 can be reduced, and the read performance can be improved.

Based on this, examples of the present disclosure further provide a computer-readable storage medium. The computer-readable storage medium stores a computer program, and when the computer program is running on a processor, the processor is enabled to execute the operation method of the memory system or the data read method of the memory as shown in FIG. 5.

All the above detailed description and beneficial effect analysis about the operation method of the memory system and the data read method of the memory may be correspondingly referred to in the memory system and the computer-readable storage medium, which are no longer repeated herein in the examples of the present application.

The above description is merely detailed description of the present disclosure, but the protection scope of the present disclosure is not limited thereto. Any variation or replacement within the technical scope disclosed in the present disclosure shall fall within the protection scope of the present disclosure. Therefore, the protection scope of the present disclosure shall be defined by the protection scope of the claims.

What is claimed is:

1. An operation method of a memory system, comprising:
   determining an offset voltage value corresponding to a selected word line of N word lines according to a number N of the N word lines and offset voltage information, wherein the N word lines are word lines adjacently disposed in a memory block of a memory, data is stored in K memory cells coupled with the N word lines, K and N are positive integers, and the offset voltage information is used for indicating the offset voltage value corresponding to N, wherein a memory cell of the K memory cells coupled with the selected word line is programmed into a plurality of programming states, and determining the offset voltage value corresponding to the selected word line of the N word lines according to the number N of the N word lines and the offset voltage information comprises:
   determining the offset voltage value corresponding to the selected word line according to N, location information of the selected word line, a preset read voltage of a selected memory cell and the offset voltage information, wherein the selected memory cell is the memory cell of the K memory cells coupled with the selected word line, the preset read voltage of the selected memory cell is a read voltage corresponding to a programming state of the selected memory cell; and
   sending a data read command to the memory, wherein the data read command is used for instructing the memory to generate a read voltage according to the offset voltage value and apply the read voltage to the selected word line.

2. The operation method of claim 1, wherein the determining the offset voltage value corresponding to the selected word line of the N word lines according to the number N of the N word lines and the offset voltage information comprises:
   determining the offset voltage value corresponding to the selected word line according to N, location information of the selected word line and the offset voltage information, wherein the location information of the selected word line is used for indicating a location of the selected word line in the N word lines.

3. The operation method of claim 2, wherein the offset voltage information is further used for indicating the offset voltage value corresponding to N and the location information of the selected word line.

4. The operation method of claim 2, wherein the selected word line comprises a first selected word line or a second selected word line, the first selected word line comprises a first word line to an $(N-1)^{th}$ word line, and the second selected word line comprises an $N^{th}$ word line; and the determining the offset voltage value corresponding to the selected word line according to N, the location information of the selected word line and the offset voltage information comprises:

determining a first offset voltage value corresponding to the first selected word line according to N, location information of the first selected word line and the offset voltage information.

5. The operation method of claim 4, wherein determining the offset voltage value corresponding to the selected word line according to N, the location information of the selected word line and the offset voltage information comprises:

determining a second offset voltage value corresponding to the second selected word line according to N, location information of the second selected word line and the offset voltage information, wherein the first offset voltage value is less than the second offset voltage value.

6. The operation method of claim 5, wherein the offset voltage information is further used for indicating the offset voltage value corresponding to N, the location information of the selected word line, and the preset read voltage of the selected memory cell.

7. The operation method of claim 1, wherein the memory block further comprises M word lines that are disposed adjacent to the N word lines, and L memory cells that are coupled with the M word lines, wherein the M word lines are disposed adjacently, data is not stored in the L memory cells, M is an integer greater than or equal to 0, and L is a positive integer; and the offset voltage information is determined according to a comparison between a first threshold voltage distribution when data is stored in the K memory cells and a second threshold voltage distribution when data is stored in the K memory cells and the L memory cells.

8. A data read method of a memory, comprising:

receiving a data read command, wherein the data read command is used for instructing the memory to generate a read voltage according to an offset voltage value and apply the read voltage to a selected word line of N word lines, wherein the offset voltage value is determined according to a number N of the N word lines and offset voltage information, the N word lines are word lines adjacently disposed in a memory block of the memory, data is stored in K memory cells coupled with the N word lines, K and N are positive integers, and the offset voltage information is used for indicating the offset voltage value corresponding to N, wherein a memory cell of the K memory cells coupled with the selected word line is programmed into a plurality of programming states; and the offset voltage value is determined according to N, location information of the selected word line, a preset read voltage of a selected memory cell and the offset voltage information, the selected memory cell is the memory cell of the K memory cells coupled with the selected word line, the preset read voltage of the selected memory cell is a read voltage corresponding to a programming state of the selected memory cell, and the offset voltage information is further used for indicating the offset voltage value corresponding to N, the location information of the selected word line, and the preset read voltage of the selected memory cell; and generating the read voltage and applying the read voltage to the selected word line according to the data read command.

9. The data read method of claim 8, wherein the offset voltage value is determined according to N, location information of the selected word line and the offset voltage information, wherein the location information of the selected word line is used for indicating a location of the selected word line in the N word lines, and the offset voltage information is further used for indicating the offset voltage value corresponding to N and the location information of the selected word line.

10. The data read method of claim 9, wherein the selected word line comprises a first selected word line or a second selected word line, the first selected word line comprises a first word line to an $(N-1)^{th}$ word line, the second selected word line comprises an $N^{th}$ word line, and the offset voltage value comprises a first offset voltage value or a second offset voltage value; and the first offset voltage value is determined according to N, location information of the first selected word line and the offset voltage information.

11. The data read method of claim 10, wherein the second offset voltage value is determined according to N, location information of the second selected word line and the offset voltage information, and the first offset voltage value is less than the second offset voltage value.

12. The data read method of claim 8, wherein the memory block further comprises M word lines that are disposed adjacent to the N word lines, and L memory cells that are coupled with the M word lines, wherein the M word lines are disposed adjacently, data is not stored in the L memory cells, M is an integer greater than or equal to 0, and L is a positive integer; and the offset voltage information is determined according to a comparison between a first threshold voltage distribution when data is stored in the K memory cells and a second threshold voltage distribution when data is stored in the K memory cells and the L memory cells.

13. A memory system, comprising a controller and a memory coupled with the controller, wherein:

the controller is configured to determine an offset voltage value corresponding to a selected word line of N word lines according to a number N of the N word lines and offset voltage information, wherein the N word lines are word lines adjacently disposed in a memory block of the memory, data is stored in K memory cells coupled with the N word lines, K and N are positive integers, and the offset voltage information is used for indicating the offset voltage value corresponding to N, wherein a memory cell of the K memory cells coupled with the selected word line is programmed into a plurality of programming states;

the controller is further configured to:

send a data read command to the memory, wherein the data read command is used for instructing the memory to generate a read voltage according to the offset voltage value and apply the read voltage to the selected word line;

determine the offset voltage value corresponding to the selected word line according to N, location information of the selected word line, a preset read voltage of a selected memory cell and the offset voltage information, wherein the selected memory cell is the memory cell of the K memory cells coupled with the selected word line, the preset read voltage of the selected memory cell is a read voltage corresponding to a programming state of the selected memory cell; and the memory is configured to receive the data read command, and generate the read voltage and apply the read voltage to the selected word line according to the data read command.

14. The memory system of claim 13, wherein the controller is further configured to determine the offset voltage value corresponding to the selected word line according to N, location information of the selected word line and the offset voltage information, wherein the location information of the selected word line is used for indicating a location of the selected word line in the N word lines.

15. The memory system of claim 14, wherein the offset voltage information is further used for indicating the offset voltage value corresponding to N and the location information of the selected word line.

16. The memory system of claim 14, wherein the selected word line comprises a first selected word line or a second selected word line, the first selected word line comprises a first word line to an $(N-1)^{th}$ word line, and the second selected word line comprises an $N^{th}$ word line; and the controller is further configured to determine a first offset voltage value corresponding to the first selected word line according to N, location information of the first selected word line and the offset voltage information.

17. The memory system of claim 16, wherein the selected word line comprises a first selected word line or a second selected word line, the first selected word line comprises a first word line to an $(N-1)^{th}$ word line, and the second selected word line comprises an $N^{th}$ word line; and the controller is further configured to determine a second offset voltage value corresponding to the second selected word line according to N, location information of the second selected word line and the offset voltage information, wherein the first offset voltage value is less than the second offset voltage value.

18. The memory system of claim 13, wherein the offset voltage information is further used for indicating the offset voltage value corresponding to N, the location information of the selected word line, and the preset read voltage of the selected memory cell.

19. The memory system of claim 13, wherein the memory block further comprises M word lines that are disposed adjacent to the N word lines, and L memory cells that are coupled with the M word lines, wherein the M word lines are disposed adjacently, data is not stored in the L memory cells, M is an integer greater than or equal to 0, and L is a positive integer.

20. The memory system of claim 19, wherein the offset voltage information is determined according to a comparison between a first threshold voltage distribution when data is stored in the K memory cells and a second threshold voltage distribution when data is stored in the K memory cells and the L memory cells.

* * * * *